US012336397B2

(12) United States Patent
Wu

(10) Patent No.: US 12,336,397 B2
(45) Date of Patent: Jun. 17, 2025

(54) DISPLAY PANEL AND DISPLAY DEVICE WITH GAP FOR RELEASING WATER VAPOR IN NON-DISPLAY AREA

(71) Applicant: Wuhan China Star Optoelectronics Semiconductor Display Technology Co., Ltd., Wuhan (CN)

(72) Inventor: Shaojing Wu, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/610,532

(22) PCT Filed: Sep. 13, 2021

(86) PCT No.: PCT/CN2021/117911
§ 371 (c)(1),
(2) Date: Nov. 11, 2021

(87) PCT Pub. No.: WO2023/029077
PCT Pub. Date: Mar. 9, 2023

(65) Prior Publication Data
US 2024/0244897 A1    Jul. 18, 2024

(30) Foreign Application Priority Data
Aug. 31, 2021    (CN) .......................... 202111013428.6

(51) Int. Cl.
*H10K 59/131*    (2023.01)
(52) U.S. Cl.
CPC .................................. *H10K 59/131* (2023.02)

(58) Field of Classification Search
CPC .................................................... H10K 59/131
See application file for complete search history.

(56) References Cited

U.S. PATENT DOCUMENTS

2017/0012094 A1*   1/2017  Lee ...................... H10K 59/353
2018/0122890 A1    5/2018  Park et al.
(Continued)

FOREIGN PATENT DOCUMENTS

| CN | 105609525 A |   | 5/2016 |            |
|----|-------------|---|--------|------------|
| CN | 106950770 A | * | 7/2017 | G02F 1/136286 |

(Continued)

OTHER PUBLICATIONS

English translation of CN 106950770 A (Year: 2017).*
(Continued)

*Primary Examiner* — Lex H Malsawma
(74) *Attorney, Agent, or Firm* — Nathan & Associates Patent Agents Ltd.; Menachem Nathan

(57) ABSTRACT

A display panel and a display device are provided in the present application. The display panel includes a substrate, a pixel drive circuit layer, a first flat layer, a first conductive layer, a second flat layer, a first electrode, a metal contact layer, a light-emitting layer, and a second electrode. The present application designs a gap provided between an edge of the metal contact layer located in a non-display area and an edge of the second flat layer, whereby water vapor within the second flat layer can be released outwardly in a longitudinal direction, reducing an occurrence probability of a red border line.

18 Claims, 5 Drawing Sheets

FIG. 2D

(56) References Cited

U.S. PATENT DOCUMENTS

| | | | | |
|---|---|---|---|---|
| 2020/0089368 A1* | 3/2020 | Shim | ............... | G06F 3/0412 |
| 2020/0105840 A1* | 4/2020 | Choi | ............... | H10K 59/873 |
| 2022/0149138 A1* | 5/2022 | Lu | ............... | H10K 59/121 |

FOREIGN PATENT DOCUMENTS

| | | | | | |
|---|---|---|---|---|---|
| CN | 109037282 A | | 12/2018 | | |
| CN | 110649069 A | | 1/2020 | | |
| CN | 110890407 A | * | 3/2020 | ........... | G09G 3/3208 |
| CN | 111341849 A | | 6/2020 | | |
| CN | 111653595 A | | 9/2020 | | |
| CN | 111969132 A | | 11/2020 | | |
| CN | 112310180 A | | 2/2021 | | |
| CN | 112366225 A | | 2/2021 | | |
| CN | 112820741 A | | 5/2021 | | |
| CN | 113053917 A | | 6/2021 | | |

OTHER PUBLICATIONS

English translation of CN 110890407 A (Year: 2020).*
International Search Report in International application No. PCT/CN2021/117911, mailed on May 27, 2022.
Written Opinion of the International Search Authority in International application No. PCT/CN2021/117911, mailed on May 27, 2022.
Chinese Office Action issued in corresponding Chinese Patent Application No. 202111013428.6 dated Nov. 30, 2022, pp. 1-7.

* cited by examiner

DISPLAY PANEL AND DISPLAY DEVICE WITH GAP FOR RELEASING WATER VAPOR IN NON-DISPLAY AREA

TECHNICAL FIELD

The present application relates to a technical field of display technology, and in particular to a display panel and a display device.

BACKGROUND

For an organic light-emitting diode (OLED) display panel, an array substrate is usually provided with a conductive layer and a flat layer covering the conductive layer. The flat layer absorbs water in an array cleaning process so that the flat layer contains water vapor. If the flat layer is covered by a metal layer, especially the flat layer located in a non-display area is covered by the metal layer, the water vapor cannot be released outward along a longitudinal direction of the display panel, but diffuses laterally inside the flat layer and into a display area. Thus, light-emitting pixels located at an edge of the display area will absorb water and cause internal shrinkage, thereby causing a red border line.

Therefore, there is an urgent need to provide a new display panel and a display device to solve the above technical problems.

Technical Problems

An embodiment of the present application provides a display panel and a display device to solve a technical problem that a flat layer of the display panel is covered with a metal layer, and water vapor releasing performance becomes poor, resulting in a red border line at an edge of a display area.

Technical Solutions

An embodiment of the present application provides a display panel and a display device to solve a technical problem that a flat layer of the display panel is covered with a metal layer, and a water vapor releasing performance becomes poor, resulting in a red border line at an edge of a display area.

The present application provides a display panel, wherein the display panel includes a display area and a non-display area surrounding the display area, the display panel includes:
- a substrate;
- a pixel drive circuit layer disposed on the substrate and located in the display area, including a plurality of pixel drive circuits;
- a first flat layer disposed on a side of the pixel drive circuit layer away from the substrate;
- a first conductive layer disposed on a side of the first flat layer away from the substrate and electrically connected to a corresponding pixel drive circuit through a first through-hole penetrating the first flat layer;
- a second flat layer disposed on a side of the first conductive layer away from the substrate;
- a first electrode disposed on a side of the second flat layer away from the substrate and electrically connected to the first conductive layer through a second through-hole penetrating the second flat layer;
- a metal contact layer disposed on a side of the pixel drive circuit layer away from the substrate and in the non-display area, provided with same conductive material as the first electrode, and wherein a gap is provided between an edge of the metal contact layer and an edge of the second flat layer, and a size of the gap is greater than or equal to 10 μm along a direction from the display area to the non-display area;
- a light-emitting layer disposed on a side of the first electrode away from the substrate; and
- a second electrode disposed on a side of the light-emitting layer away from the substrate and electrically connected to the metal contact layer in the non-display area.

According to the display panel provided herein, the non-display area includes a first non-display area and a second non-display area, the first non-display area is located between the display area and the second non-display area, the second flat layer extends from the display area to the first non-display area, and the metal contact layer is disposed in the second non-display area.

According to the present application, the display panel further including:
- a second conductive layer disposed on a side of the second flat layer away from the substrate; and
- a third flat layer disposed on a side of the second conductive layer away from the substrate, and wherein the first electrode is electrically connected to the second conductive layer through a third through-hole penetrating the third flat layer, the second conductive layer is electrically connected to the first conductive layer through the second through-hole, and a gap is provided between the edge of the metal contact layer and an edge of the third flat layer.

According to the present application, the display panel further including:
- a third conductive layer disposed on a side of the third flat layer away from the substrate; and
- a fourth flat layer disposed on a side of the third conductive layer away from the substrate, and wherein the first electrode is electrically connected to the third conductive layer through a fourth through-hole penetrating the fourth flat layer, the third conductive layer is electrically connected to the second conductive layer through the third through-hole, and a gap is provided between the edge of the metal contact layer and an edge of the fourth flat layer.

According to the display panel provided herein, the light-emitting layer comprises a plurality of light-emitting pixels, the display panel comprises a plurality of first vent holes defined in the display area, the first vent hole is defined between the first electrodes corresponding to the adjacent light-emitting pixels, one end of the first vent hole extends to the first electrode, and the other end of the first vent hole penetrates the second flat layer.

According to the display panel provided herein, the first vent hole is defined close to the non-display area.

The present application provides a display panel, wherein the display panel includes a display area and a non-display area surrounding the display area, the display panel includes:
- a substrate;
- a pixel drive circuit layer disposed on the substrate and located in the display area, and including a plurality of pixel drive circuits;
- a first flat layer disposed on a side of the pixel drive circuit layer away from the substrate;
- a first conductive layer disposed on a side of the first flat layer away from the substrate and electrically connected to a corresponding pixel drive circuit through a first through-hole penetrating the first flat layer;

a second flat layer disposed on a side of the first conductive layer away from the substrate;

a first electrode disposed on a side of the second flat layer away from the substrate and electrically connected to the first conductive layer through a second through-hole penetrating the second flat layer;

a metal contact layer disposed on a side of the pixel drive circuit layer away from the substrate and in the non-display area, and a gap being provided between an edge of the metal contact layer and an edge of the second flat layer;

a light-emitting layer disposed on a side of the first electrode away from the substrate; and a second electrode disposed on a side of the light-emitting layer away from the substrate and electrically connected to the metal contact layer in the non-display area.

According to the display panel provided herein, the non-display area comprises a first non-display area and a second non-display area, the first non-display area is located between the display area and the second non-display area, the second flat layer extends from the display area to the first non-display area, and the metal contact layer is disposed in the second non-display area.

According to the present application, the display panel further comprising:

a second conductive layer disposed on a side of the second flat layer away from the substrate; and a third flat layer disposed on a side of the second conductive layer away from the substrate, and wherein the first electrode is electrically connected to the second conductive layer through a third through-hole penetrating the third flat layer, the second conductive layer is electrically connected to the first conductive layer through the second through-hole, and a gap is provided between the edge of the metal contact layer and an edge of the third flat layer.

According to the present application, the display panel further comprising:

a third conductive layer disposed on a side of the third flat layer away from the substrate; and a fourth flat layer disposed on a side of the third conductive layer away from the substrate, and wherein the first electrode is electrically connected to the third conductive layer through a fourth through-hole penetrating the fourth flat layer, the third conductive layer is electrically connected to the second conductive layer through the third through-hole, and a gap is provided between the edge of the metal contact layer and an edge of the fourth flat layer.

According to the display panel provided herein, the light-emitting layer includes a plurality of light-emitting pixels, the display panel comprises a plurality of first vent holes defined in the display area, the first vent hole is defined between the first electrodes corresponding to the adjacent light-emitting pixels, one end of the first vent hole extends to the first electrode, and the other end of the first vent hole penetrates the second flat layer.

According to the display panel provided herein, the first vent hole is defined close to the non-display area.

According to the display panel provided herein, a plurality of second vent holes are provided at intervals on the metal contact layer, and the second vent hole penetrates the metal contact layer.

According to the display panel provided herein, the second vent hole is defined close to the display area.

According to the display panel provided herein, a size of the gap is greater than or equal to 10 μm along a direction from the display area to the non-display area.

According to the display panel provided herein, the pixel drive circuit layer includes:

a semiconductor layer disposed on the substrate;

a gate insulating layer overlaid on the semiconductor layer;

a first gate layer disposed on the gate insulating layer;

a first interlayer insulated layer overlaid on the first gate layer and the gate insulating layer;

a second gate layer disposed on the first gate layer;

a second interlayer insulated layer overlaid on the second gate layer and the first interlayer insulated layer;

a source drain metal layer disposed on the second interlayer insulated layer, and wherein the first conductive layer is electrically connected to the source drain metal layer through the first through-hole; and the first flat layer disposed on the source drain metal layer.

The display panel according to the present application further includes a power supply signal line disposed in the non-display area, the power supply signal line is disposed on a same layer as the source drain metal layer, and the metal contact layer is electrically connected to the power supply signal line.

According to the display panel provided herein, the metal contact layer is provided with same conductive material as the first electrode.

According to the present application, the display area includes a main display area, a light transmission area, and a transition display area between the main display area and the light transmission area; and the first conductive layer comprises a plurality of transparent traces extending from the transition display area to the light transmission area, and wherein the plurality of pixel drive circuits comprises a first pixel drive circuit disposed in the transition display area, the light-emitting layer comprises a first light-emitting layer disposed in the light transmission area, and the first pixel drive circuit is electrically connected to the first light-emitting layer through the transparent traces to drive the first light-emitting layer to emit light.

A display device, comprising a display panel, and a sensing unit disposed on a side of the display panel and corresponding to a light transmission area, wherein the display panel comprises a display area and a non-display area surrounding the display area, the display area comprises a main display area, a light transmission area, and the transition display area between the main display area and the light transmission area, and the display panel comprises:

a substrate;

a pixel drive circuit layer disposed on the substrate and located in the display area, and comprising a plurality of pixel drive circuits;

a first flat layer disposed on a side of the pixel drive circuit layer away from the substrate;

a first conductive layer disposed on a side of the first flat layer away from the substrate and electrically connected to a corresponding pixel drive circuit through a first through-hole penetrating the first flat layer;

a second flat layer disposed on a side of the first conductive layer away from the substrate;

a first electrode disposed on a side of the second flat layer away from the substrate and electrically connected to the first conductive layer through a second through-hole penetrating the second flat layer;

a metal contact layer disposed on a side of the pixel drive circuit layer away from the substrate and in the non-display area, and wherein a gap is provided between an edge of the metal contact layer and an edge of the second flat layer;

a light-emitting layer disposed on a side of the first electrode away from the substrate; and a second electrode disposed on a side of the light-emitting layer away from the substrate and electrically connected to the metal contact layer in the non-display area.

Beneficial Effects

The display panel and the display device provided in the present application have the following advantageous effects: a gap is provided between an edge of a metal contact layer in a non-display area and an edge of a second flat layer covering a first conductive layer, that is, the second flat layer is not shielded by the metal contact layer in the non-display area by the design of the present application, so that water vapor in the second flat layer can be released longitudinally outward. Thus, water vapor releasing performance of the second flat layer is improved. A situation where the light-emitting pixels at the edge of the display area absorbs water to internally shrink, and wherein the inner shrinkage is caused by the water vapor laterally diffusing inside the second flat layer and into the display area, is improved. The occurrence probability of the red border line is reduced, and the display effect of the display panel is improved.

BRIEF DESCRIPTION OF THE DRAWINGS

In order to more clearly illustrate technical solutions in embodiments of the present application, drawings required for use in the description of the embodiments will be briefly described below. It will be apparent that the drawings in the following description merely relate to some embodiments of the present application, and other drawings may be obtained from these drawings without creative effort by those skilled in the art.

DESCRIPTION OF REFERENCE NUMERALS

Figure 1:
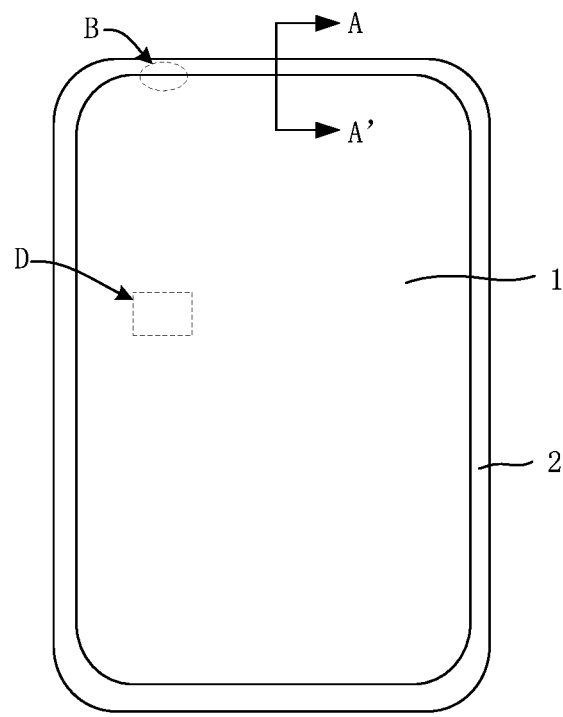
FIG. 1 is a schematic plan diagram of a display panel according to an embodiment of the present application.

1. Display area; 11. Main display area; 12. Display light transmitting area; 13. Transition display area; 2. non-display area; 21. First non-display area; 22. Second non-display area; and 101. Substrate; 102. Pixel drive circuit layer; 102a. First pixel drive circuit; 102b. Second pixel drive circuit; 1021. Semiconductor layer; 1022. Gate insulating layer; 1023. First gate layer; 1024. First interlayer insulated layer; 1025. Second gate layer; 1026. Second interlayer insulated layer; 1027. Source drain metal layer; 103. First flat layer; 1031. First through-hole; 104. First conductive layer; 105. Second flat layer; 1051. Second through-hole; 106. First electrode; 107. Metal contact layer; 108. Light-emitting layer; 108a. First light-emitting layer; 108b. Second light-emitting layer; 1081. Red light-emitting pixel; 1082. Green light-emitting pixel; 1083. Blue light-emitting pixel; 109. Second electrode; 110. Pixel definition layer; 111. Second conductive layer; 112. Third flat layer; 1121. Third through-hole; 113. Third conductive layer; 114. Fourth flat layer; 1141. Fourth through-hole; 115. First vent hole; 116. Second vent hole; and 117. Power supply signal line.

DETAILED DESCRIPTION OF THE EMBODIMENTS

The following describes the technical solutions of the embodiments of the present application in a clear and complete manner with reference to the drawings in the embodiments of the present application. It will be apparent that the described embodiments are only a part of the embodiments of the present application, but not all of the embodiments. Based on the embodiments of the present application, all other embodiments obtained by those skilled in the art without creative effort fall within the scope of the present application. Furthermore, it should be understood that the specific embodiments described herein are intended only to illustrate and explain the present application and are not intended to limit the present application. Terms, for example, 'up' and 'low' are used in the present application in the absence of a reverse description, generally referring to up and low of the device in actual use or operation, in particular referring to a direction of the drawing. Terms 'inner' and 'outer' are for a profile of the device.

Referring to FIG. 1, FIG. 1 is a schematic plan diagram of a display panel according to an embodiment of the present application.

An embodiment of the present application provides a display panel including a display area 1, and a non-display area 2 surrounding the display area 1. The display area 1 is used for displaying images, and the non-display area 2 is a frame area of the display panel for placing a drive circuit and the like.

Figure 2A:
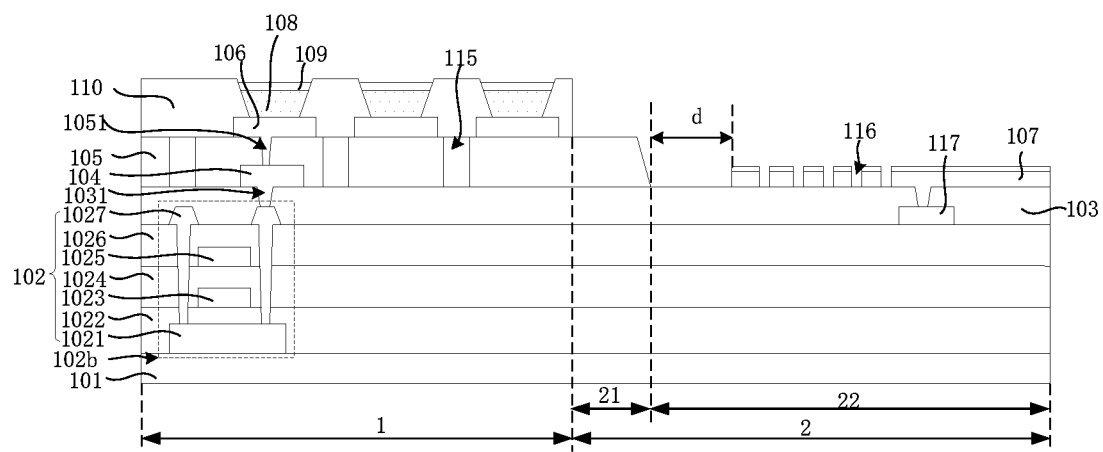
FIGS. 2A to 2D are cross-sectional views taken along A-A' of FIG. 1.
Figure 3:
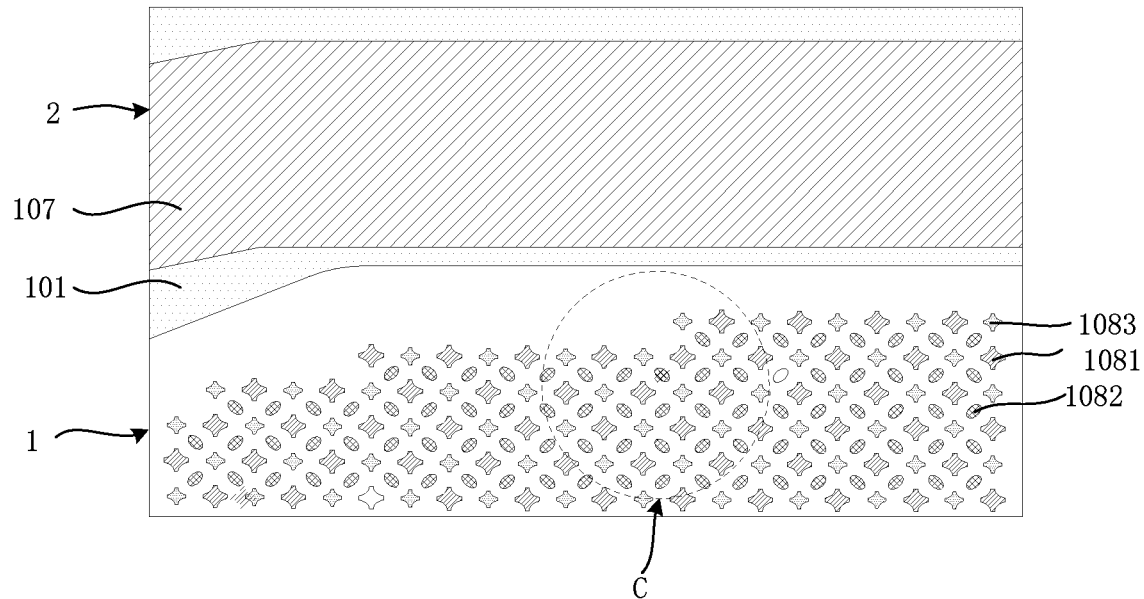
FIG. 3 is a partially enlarged schematic diagram of B of FIG. 1.

Referring to FIG. 2A and FIG. 3 in combination, FIG. 2A is a cross-sectional view taken along A-A' of FIG. 1, and FIG. 3 is a partially enlarged schematic diagram of B of FIG. 1.

The display panel includes a substrate 101, a pixel drive circuit layer 102, a first flat layer 103, a first conductive layer 104, a second flat layer 105, a first electrode 106, a metal contact layer 107, a light-emitting layer 108, and a second electrode 109.

The pixel drive circuit layer 102 is disposed on the substrate 101 and located in the display area 1. The pixel drive circuit layer 102 includes a plurality of pixel drive circuits. The first flat layer 103 is disposed on a side of the pixel drive circuit layer 102 away from the substrate 101. The first conductive layer 104 is disposed on a side of the first flat layer 103 away from the substrate 101, and is electrically connected to a corresponding pixel drive circuit through a first through-hole 1031 penetrating the first flat layer 103. The second flat layer 105 is disposed on a side of the first conductive layer 104 away from the substrate 101. The first electrode 106 is disposed on a side of the second flat layer 105 away from the substrate 101, and electrically connected to the first conductive layer 104 through a second through-hole 1051 penetrating the second flat layer 105. The metal contact layer 107 is disposed on a side of the pixel drive circuit layer 102 away from the substrate 101, and is disposed in the non-display area 2. A gap d is provided between an edge of the metal contact layer 107 and an edge of the second flat layer 105. The light-emitting layer 108 is disposed on a side of the first electrode 106 away from the substrate 101. The second electrode 109 is disposed on a side of the light-emitting layer 108 away from the substrate 101, and is electrically connected to the metal contact layer 107 in the non-display area 2.

It will be understood that, since the second flat layer 105 is an organic film layer, when the display panel is subjected to a cleaning operation under high temperature and high humidity conditions, a large amount of water vapor is generated inside the second flat layer 105. Since gathering of the water vapor causes damage to the light-emitting layer 108 and other layers, there is a need to release the water vapor into outside air. A gap d between the edge of the metal contact layer 107 and the edge of the second flat layer 105 is provided in the embodiment of the present application, that is, the second flat layer 105 is not covered by the metal contact layer 107, thus, the metal contact layer 107 does not block the water vapor in the second flat layer 105 from releasing. Therefore, the water vapor in the second flat layer 105 may be smoothly released to the outside air along a longitudinal direction. A water vapor releasing performance of the second flat layer 105 is improved, thereby improving a situation that the light-emitting layer 108 at the edge of the display area 1 internally shrinks by absorbing water, due to the water vapor laterally diffusing inside the second flat layer 105 and into the display area 1. Thus, an occurrence probability of the red border line is reduced, and display effect of the display panel is promoted.

Specifically, the first electrode 106 is an anode, and the second electrode 109 is a cathode. Preparation material of the first electrode 106 includes a transparent conducting thin film. The preparation material of the first electrode 106 further includes any of indium tin oxide, indium tin zinc oxide, and the like, or a combination of indium tin oxide, indium tin zinc oxide, silver, and the like.

Specifically, the metal contact layer 107 and the first electrode 106 have a same conducting material. Further, the metal contact layer 107 and the first electrode 106 are disposed in same layer. Further, the metal contact layer 107 and the first electrode 106 may be prepared by same process.

Specifically, the light-emitting layer 108 includes a plurality of light-emitting pixels including at least a red light-emitting pixel 1081, a green light-emitting pixel 1082, and a blue light-emitting pixel 1083. And the light-emitting layer 108 includes any of quantum dot material, perovskite material, and fluorescent material.

Figure 4:
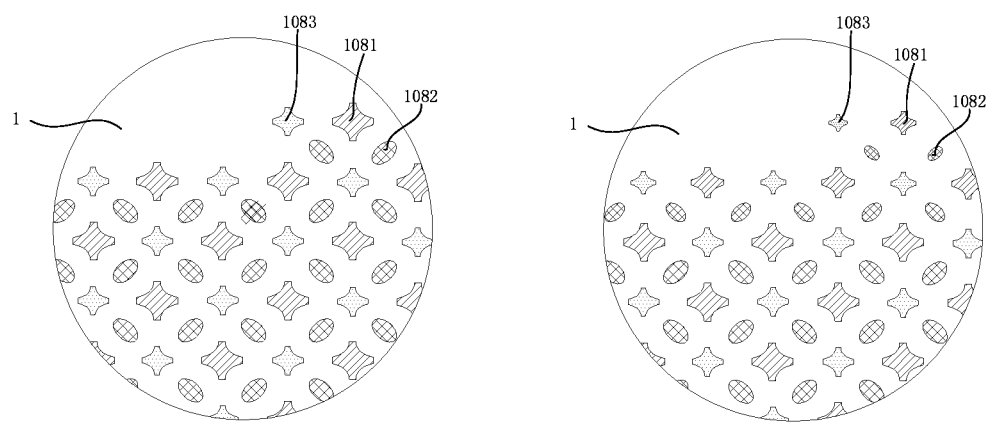
FIG. 4 is a schematic diagram comparing a partially enlarged structure of C of FIG. 3 to prior art.

In order to prove that the above-described design of the present application has a significant improvement on the water vapor releasing performance of the second flat layer 105, the applicant performed product function verification on the display panel provided in the embodiment of the present application, and the specific experimental results are referred to as follows:

Referring to FIG. 4, FIG. 4 is a schematic diagram comparing a partially enlarged structure of C of FIG. 3 to prior art. A left view is a partial enlarged schematic diagram of a display panel provided in an embodiment of the present application, and a right view is a partial enlarged schematic diagram of a display panel provided in the prior art.

Specifically, the display panel in the left view and the display panel in the right view each include a plurality of light-emitting pixels arranged in an array. The plurality of light-emitting pixels includes a red light-emitting pixel 1081, a green light-emitting pixel 1082, and a blue light-emitting pixel 1083. A light-emitting area of the blue light-emitting pixel 1083 is larger than that of the red light-emitting pixel 1081, and a light-emitting area of the red light-emitting pixel 1081 is larger than that of the green light-emitting pixel 1082.

It can be clearly seen that the light-emitting pixels located at an edge of a display area 1 in the right view internally shrink proportionally compared with the light-emitting pixels in other areas of the display area 1, that is, an effective light-emitting area of the light-emitting pixels located at the edge of the display area 1 is reduced, thereby dimming brightness.

Specifically, for the plurality of light-emitting pixels located in a same pixel row, an internal shrinkage ratio of the green light-emitting pixel 1082 is larger than an internal shrinkage ratio of the red light-emitting pixel 1081 and the blue light-emitting pixel 1083, so that the effective light-emitting area of the green light-emitting pixel 1082 is larger than the effective light-emitting area of the red light-emitting pixel 1081 and the blue light-emitting pixel 1083. Therefore, brightness of the green light-emitting pixel 1082 is dimmer than brightness of the red light-emitting pixel 1081 and the blue light-emitting pixel 1083, resulting in a red border line visually overall.

For the plurality of light-emitting pixels located in different pixel rows, an internal shrinkage ratio of the light-emitting pixels near the edge of the display area 1 is larger than an internal shrinkage ratio of the light-emitting pixels far from the edge of the display area 1, so that a brightness of the light-emitting pixels near the edge of the display area 1 is dimmer than a brightness of the light-emitting pixels far from the edge of the display area 1, thereby causing unevenness in a brightness of display images of the display panel and affecting display effect.

Comparatively, there is no obvious shrinkage phenomenon of the light-emitting pixels located at the edge of the display area 1 in the left view, that is, effective light-emitting area of the light-emitting pixels located at the edge of the display area 1 did not change significantly, and brightness remains substantially unchanged. Specifically, a plurality of the red light-emitting pixels 1081 located in different pixel rows have equal light-emitting areas, a plurality of the green light-emitting pixels 1082 located in different pixel rows have equal light-emitting areas, and a plurality of the blue light-emitting pixels 1083 located in different pixel rows have equal light-emitting areas. That is, a brightness of the light-emitting pixels with each color near the edge of the display area 1 and a brightness of the light-emitting pixels with each color away from the edge of the display area 1 are equal, and no red border line is visible overall.

Therefore, according to the display panel provided in an embodiment of the present application, by designing the gap between the edge of the metal contact layer 107 and the edge of the second flat layer 105, the water vapor in the second flat layer 105 may be released longitudinally outward. The water vapor releasing performance of the second flat layer 105 is improved, thereby improving a situation where the light-emitting pixel at the edge of the display area 1 internally shrinks by absorbing water, and wherein the internal shrinkage is caused by the water vapor laterally diffusing inside the second flat layer 105 and into the display area 1. Thus, the internal shrinkage ratio of the light-emitting pixel at the edge of the display is reduced. An occurrence probability of the red border line is reduced, and display effect of the display panel is promoted.

Referring back to FIG. 2A, in an embodiment of the present application, the non-display area 2 includes a first non-display area 21 and a second non-display area 22. The first non-display area 21 is located between the display area 1 and the second non-display area 22. The second flat layer 105 extends from the display area 1 to the first non-display area 21, and the metal contact layer 107 is disposed in the second non-display area 22.

It is understood that, in an embodiment, an area of the first non-display area 21 may be greater than zero, and in other embodiments, the area of the first non-display area 21 may also be zero. That is, the non-display area 2 includes only the second non-display area 22, and a side of the second flat layer 105 near the second non-display area 22 is located at a boundary position between the display area 1 and the non-display area 2.

Further, the gap d is dimensioned in a range of greater than or equal to 10 μm along a direction from the display area 1 to non-display area 2, to ensure that water vapor within the second flat layer 105 may be released longitudinally outward. For example, the gap may be any of 10 μm, 20 μm, 30 μm, and 40 μm.

Further, the second flat layer 105 and the metal contact layer 107 may be prepared by the following steps: Firstly, an organic insulating material is deposited over the first conductive layer 104 and the first flat layer 103; Next, the deposited organic insulating material is subjected to a yellow light process using a mask to remove the organic insulating material located in the second non-display area 22, to form the second flat layer 105; Subsequently, an anode material is deposited over the second flat layer 105 and the first flat layer 103; Finally, the deposited anode material is subjected to a yellow light process using a mask to remove a portion of the anode material located in the second non-display area 22, to form the metal contact layer 107.

In an embodiment, referring to FIG. 2A, a new mask may be used to prepare the second flat layer 105, and a mask used to prepare the metal contact layer 107 may be a mask used to prepare a metal contact layer 107 in an existing display panel. Compared with prior art, in this embodiment, the second flat layer 105 may be partially removed, and the metal contact layer 107 is not removed, so that a gap is defined between an edge of the metal contact layer 107 and an edge of the second flat layer 105.

Figure 2B:
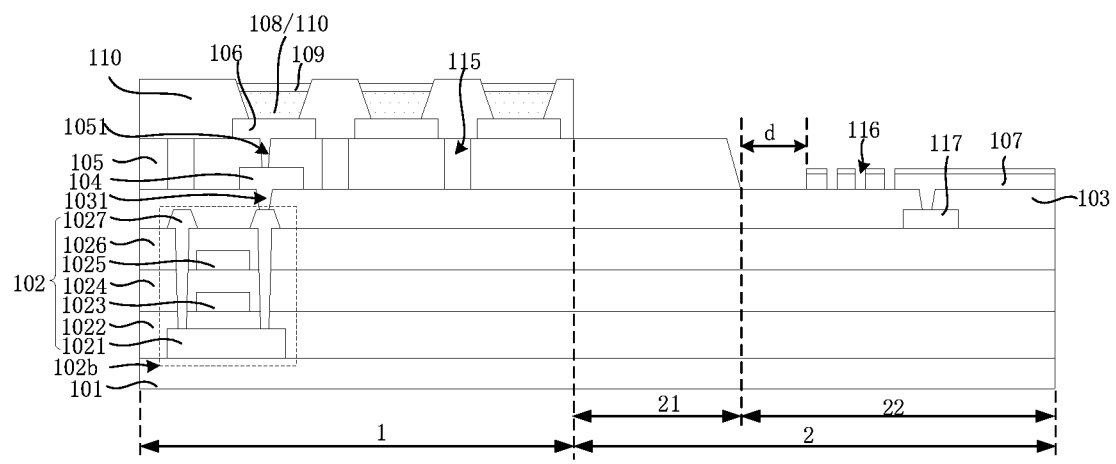

In an embodiment, referring to FIG. 2B, FIG. 2B is a cross-sectional view taken along A-A' of FIG. 1. The mask used to prepare the second flat layer 105 may be a mask used to prepare a flat layer in an existing display panel, and the mask used to prepare the metal contact layer 107 may be a new mask. Compared with prior art, in this embodiment, the metal contact layer 107 may be partially removed, and the second flat layer 105 is not removed, so that a gap is also defined between the edge of the metal contact layer 107 and the edge of the second flat layer 105.

Figure 2C:
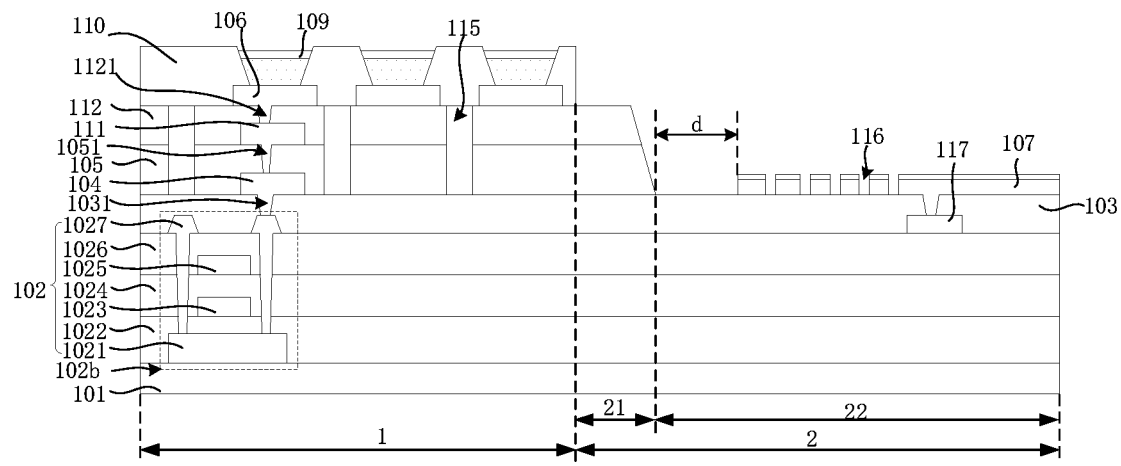

Further, referring to FIG. 2C, FIG. 2C is a cross-sectional view taken along A-A' of FIG. 1.

FIG. 2C is different from FIG. 2A in that in order to further improve a wiring space of a trace in a conductive layer, the display panel further includes a second conductive layer 111 and a third flat layer 112. The second conductive layer 111 is disposed on a side of the second flat layer 105 away from the substrate 101, the third flat layer 112 is disposed on a side of the second conductive layer 111 away from the substrate 101, the first electrode 106 is electrically connected to the second conductive layer 111 through a third through-hole 1121 penetrating the third flat layer 112, and the second conductive layer 111 is electrically connected to the first conductive layer 104 through the second through-hole 1051. There is a gap is defined between the edge of the metal contact layer 107 and the edge of the third flat layer 112.

It is understood that the metal contact layer 107 does not cover the second flat layer 105 and the third flat layer 112, and the metal contact layer 107 does not block a release of water vapor in the second flat layer 105 and the third flat layer 112. The water vapor in the second flat layer 105 and the third flat layer 112 can be smoothly released into outside air in the longitudinal direction, improving water vapor releasing performance of the second flat layer 105 and the third flat layer 112. The situation where the light-emitting layer 108 at the edge of the display area 1 absorbs water to internally shrink, and wherein the internal shrinkage is caused by the water vapor laterally diffusing inside the second flat layer 105 and the third flat layer 112, is improved, and into the display area 1. The occurrence probability of the red border line is reduced, and the display effect of the display panel is improved.

Figure 2D:
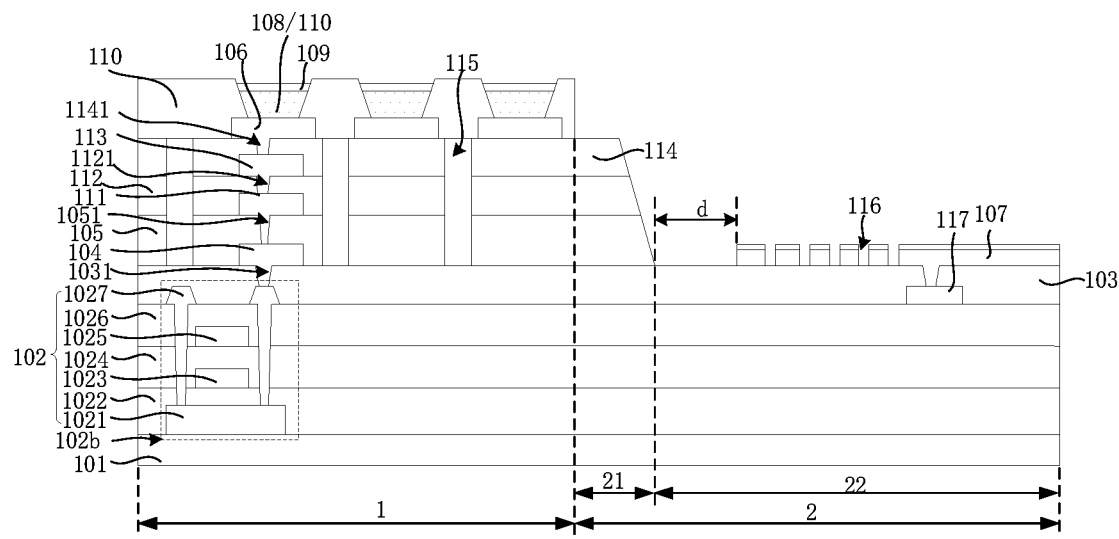

Further, referring to FIG. 2D, FIG. 2D is a cross-sectional view taken along A-A' of FIG. 1.

FIG. 2D is different from FIG. 2C in that in order to further improve the wiring space of the traces in the conductive layer, the display panel further includes a third conductive layer 113 and a fourth flat layer 114, the third conductive layer 113 is disposed on a side of the third flat layer 112 away from the substrate 101, the fourth flat layer 114 is disposed on a side of the third conductive layer 113 away from the substrate 101, the first electrode 106 is electrically connected to the third conductive layer 113 through a fourth through-hole 1141 penetrating the fourth flat layer 114, and the third conductive layer 113 is electrically connected to the second conductive layer 111 through the through-hole 1121. There is a gap between the edge of the metal contact layer 107 and the edge of the fourth flat layer 114.

It will be understood that the metal contact layer 107 does not cover the second flat layer 105, the third flat layer 112, and the fourth flat layer 114. The metal contact layer 107 does not block the release of water vapor in the second flat layer 105, the third flat layer 112, and the fourth flat layer 114. The water vapor in the second flat layer 105, the third flat layer 112, and the fourth flat layer 114 can be smoothly released into outside air in the longitudinal direction, improving water vapor releasing performance of the second flat layer 105, the third flat layer 112, and the fourth flat layer 114. The situation where light-emitting layer 108 at the edge of the display area 1 absorbs water to internally shrink, and wherein the internal shrinkage is caused by the water vapor laterally diffusing inside the second flat layer 105, the third flat layer 112, and the fourth flat layer 114, and into the display area 1, is improved. The occurrence probability of the red border line is reduced, and the display effect of the display panel is improved.

It should be noted that the first through-hole 1031, the second through-hole 1051, the third through-hole 1121, and the fourth through-hole 1141 mentioned in this embodiment refer to through-holes penetrating a same film layer, and not necessarily refer to the same through-hole. For example, the second through-hole 1051 refers to a through-hole penetrating the second flat layer, the second through-hole 1051 in FIG. 2A, for electrically connecting the first electrode 106 and the first conductive layer 104, penetrates the second flat layer, and the second through-hole 1051 in FIG. 2C, for electrically connecting the second conductive layer 111 and the first conductive layer 104, also penetrates the second flat layer, but the second through-holes 1051 in FIG. 2A and FIG. 2C are not necessarily the same through-hole.

Further, the first flat layer 103 may be provided with a conductive layer on the side away from the substrate 101, or may be provided with a plurality of conductive layers. Accordingly, in order to cover each of the conductive layers, the first flat layer 103 may be provided with a flat layer on a side away from the substrate 101, or may be provided with a plurality of flat layers. However, the present application is not limited to this embodiment.

Further, in the display area 1, there is inevitably an area where the first electrode 106 overlaps with the flat layer provided on a side of the first flat layer 103 away from the substrate 101, and the area overlapped causes the first electrode 106 to block the release of the water vapor in the flat layer. Thus, the water vapor cannot be smoothly released, causing the light-emitting pixel located in the display area 1 to absorb water and internally shrink, reducing brightness of the light-emitting pixels, and affecting the display effect.

Figure 5:
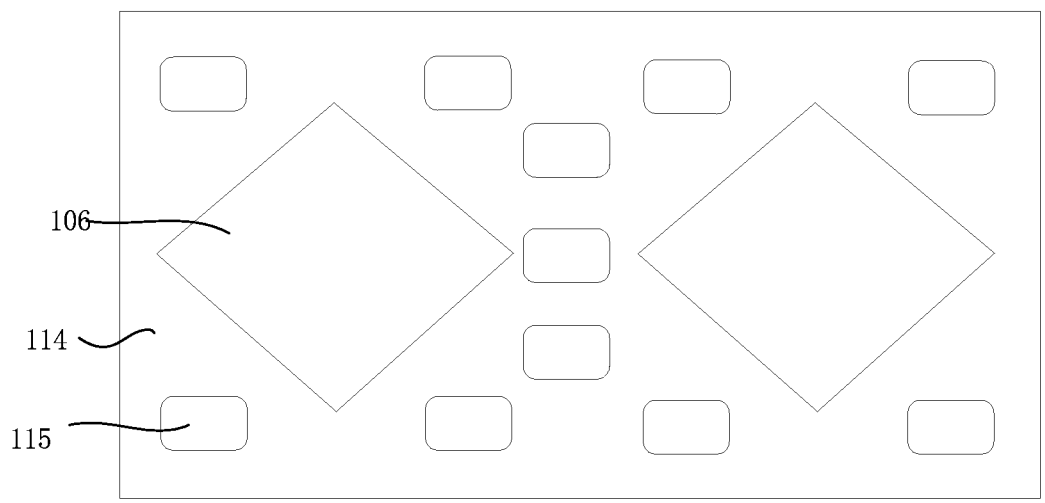
FIG. 5 is a partially enlarged schematic diagram of D of FIG. 1.

Referring again to FIG. 2A, FIG. 2B and FIG. 5 in combination, FIG. 5 is a partially enlarged schematic diagram of D of FIG. 1.

In an embodiment of the present application, the display panel includes a plurality of first vent holes 115 defined between the first electrodes 106 corresponding to the adjacent light-emitting pixels, one end of the first vent holes 115 extends to the first electrode 106, and the other end of the first vent hole 115 extends through the second flat layer 105. Each of the first vent holes 115 is perpendicular to a plane of the display panel, i.e., each of the first vent holes 115 extends longitudinally. The first vent hole 115 is of a hollowed-out design so that a volume of the second flat layer 105 is decreased, and accordingly, an amount of water vapor in the second flat layer 105 is also decreased, thereby facilitating a reduction of the probability of internal shrinkage of the light-emitting pixels due to unsmooth release of water vapor.

In an embodiment, referring to FIG. 2C, FIG. 2C differs from FIG. 2A in that the first vent hole 115 penetrates through the second flat layer 105 and the third flat layer 112, to decrease the volume of the second flat layer 105 and the third flat layer 112, and accordingly, to decrease the amount of water vapor in the second flat layer 105 and the third flat layer 112, thereby facilitating the reduction of the probability of internal shrinkage of the light-emitting pixels due to unsmooth release of water vapor.

In one embodiment, referring to FIG. 2D, FIG. 2D differs from FIG. 2c in that the first vent hole 115 penetrates through the second flat layer 105, the third flat layer 112, and the fourth flat layer 114, so that the volumes of the second flat layer 105, the third flat layer 112, and the fourth flat layer 114 are reduced, and accordingly, the amount of water vapor in the second flat layer 105, the third flat layer 112, and the fourth flat layer 114 are also reduced, thereby facilitating the reduction of the probability of internal shrinkage of the light-emitting pixels due to unsmooth release of water vapor.

Specifically, the first vent hole 115 is defined close to the non-display area 2, which is advantageous in reducing internal shrinkage ratio of the light-emitting pixels at the edge of the display area 1, further reducing the occurrence probability of the red border line, and improving the display effect of the display panel.

Further, since the first flat layer 103 is also an organic film layer, and the first flat layer 103 is shielded by the metal contact layer 107, the water vapor in the first flat layer 103 cannot be released. Therefore, in an embodiment of the present application, a plurality of second vent holes 116 are defined on the metal contact layer 107 and are defined at intervals, and the second vent holes 116 penetrate through the metal contact layer 107 to expose the surface of the first flat layer 103, so that the water vapor in the first flat layer 103 can be smoothly released.

Further, the second vent hole 116 is defined close to the display area 1 to ensure that water vapor in the first flat layer 103 can be smoothly released without entering the display area 1, thereby further reducing the occurrence probability of the red border line.

Referring further to FIGS. 2A to 2D in combination, a film structure of the pixel drive circuit layer 102 will be described in detail below.

The pixel drive circuit layer 102 includes a plurality of transistors, each of the transistors includes a semiconductor layer 1021, a gate insulating layer 1022, a first gate layer 1023, a first interlayer insulated layer 1024, a second gate layer 1025, a second interlayer insulated layer 1026, a source drain metal layer 1027, and the first flat layer 103.

The semiconductor layer 1021 is disposed on the substrate 101, the gate insulating layer 1022 is overlaid on the semiconductor layer 1021, the first gate layer 1023 is disposed on the gate insulating layer 1022, the first interlayer insulated layer 1024 is overlaid on the first gate layer 1023 and the gate insulating layer 1022, the second gate layer 1025 is disposed on the first gate layer 1023, the second interlayer insulated layer 1026 is overlaid on the second gate layer 1025 and the first interlayer insulated layer 1024, the source drain metal layer 1027 is disposed on the second interlayer insulated layer 1026, the first conductive layer 104 is electrically connected to the source drain metal layer 1027 through the first through-hole 1031, and the first flat layer 103 is disposed on the source drain metal layer 1027.

The transistor includes at least one of oxide transistor and silicon transistor. The transistor is a field effect transistor. Further, the transistor includes a thin film transistor. It can be understood that the structure of the transistor is not limited to the double-gate structure shown in FIGS. 2A to 2D, and a person skilled in the art may use other structures, such as a single-gate structure, which will not be described here again.

Further, the display panel further includes a power supply signal line 117 disposed in the non-display area 2, and the power supply signal line 117 is disposed in the same layer with the source drain metal layer 1027. The metal contact layer 107 is electrically connected to the power supply signal line 117 so that the second electrode 109 is electrically connected to the power supply signal line 117 through the metal contact layer 107. When the display panel operates, a driving signal provided by a driving chip is loaded on the power supply signal line 117, and the power supply signal line 117 is in contact with the metal contact layer 107. Then, the driving signal is transmitted to the second electrode 109 by contacting the second electrode 109 with the metal contact layer 107 so that the light-emitting layer 108 can emit light normally.

Specifically, the power supply signal line 117 may be a low-potential power supply line, and may provide a low-potential power supply voltage.

In an embodiment, referring to FIG. 2A, the display panel is of a double-layer source drain metal layer design in which the first conductive layer 104 serves as an upper source drain metal layer, and the source drain metal layer 1027 serves as a lower source drain metal layer. Such a design facilitates balancing impedance.

Figure 6:
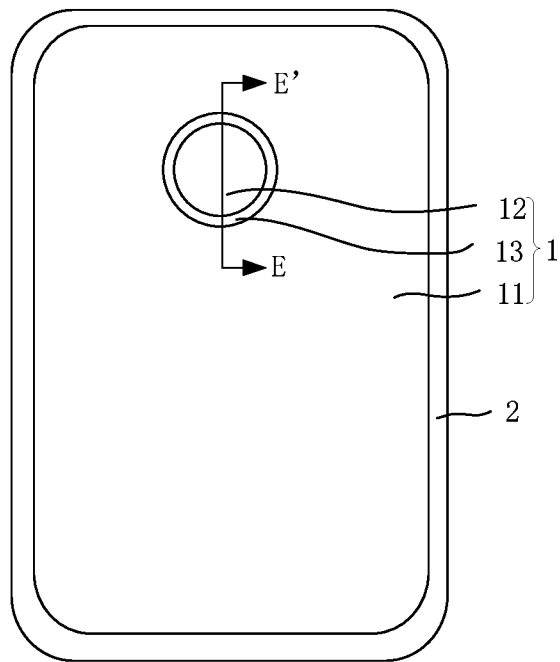
FIG. 6 is a schematic plan diagram of another display panel according to an embodiment of the present application.
Figure 7:
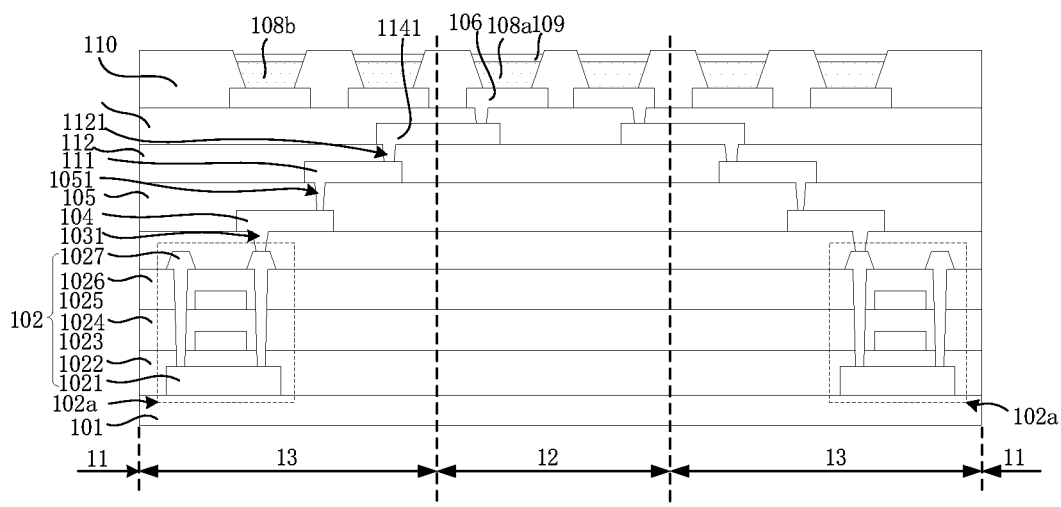
FIG. 7 is a cross-sectional view taken along E-E' of FIG. 6.

In an embodiment, referring to FIG. 6 and FIG. 7 in combination, FIG. 6 is a schematic plan diagram of another display panel according to an embodiment of the present application, and FIG. 7 is a cross-sectional view taken along E-E' of FIG. 6. The display panel may be designed with an under-screen camera. The display panel may include three conductive layers.

Specifically, the display area 1 includes a main display area 11, a display light transmitting area 12, and a transition display area 13 between the main display area 11 and the display light transmitting area 12. A structure shown in FIG. 2D is a structure of the display panel corresponding to the main display area.

Each of the first conductive layer 104, the second conductive layer 111, and the third conductive layer 113 includes a plurality of transparent traces, and at least one layer of the transparent traces extends from the transition display area 13 to the display light transmitting area 12. The plurality of pixel drive circuits include a first pixel drive circuit 102a located in the transition display area 13. The light-emitting layer 108 includes a first light-emitting layer 108a located in the display light transmitting area 12. The first pixel drive circuit 102a is electrically connected to the light-emitting layer 108a through the transparent traces located in different layers, to drive the first light-emitting layer 108a to emit light. While the display light transmitting area 12 is used for displaying an image, a photosensitive unit located on a side of the display panel corresponding to the display light transmitting area 12 receives a light signal, through a light, at a same time.

Specifically, preparation material of the transparent trace is at least one of indium tin oxide or indium zinc oxide.

It can be understood that, in an embodiment of the present application, the plurality of transparent traces are electrically connected to the light-emitting pixel located in the display light transmitting area 12 and a corresponding first pixel drive circuit 102a located in the transition display area 13, so that wiring space can be increased, and light transmittance of the display light transmitting area 12 can be improved, thereby improving photographing of the under-screen camera and display effects.

Similarly, in an embodiment of the present application, a flat layer covering a plurality of the transparent traces is introduced, and an area of the flat layer covering the metal contact layer 107 easily causes a technical problem of unsmooth release of water vapor. The technical problem can be solved by the above technical solution provided in an embodiment of the present application. For details, refer to the above description, and not describe here again.

Further, referring to FIGS. 2A-2D, the plurality of pixel drive circuits further include a plurality of second pixel drive circuits 102b. The plurality of light-emitting layers 108 further include a plurality of second light-emitting layers 108b located in the transition display area 13, and the second pixel drive circuits 102b is electrically connect the second light-emitting layers 108b through the transparent traces to drive the second light-emitting layers 108b to emit light.

An embodiment of the present application further provides a display device including the display panel in the above-described embodiment. The display device further includes a photosensitive unit when the display panel is designed with an under-screen camera. The display area 1 includes a main display area 11, a display light transmitting area 12, and a transition display area 13 between the main display area 11 and the display light transmitting area 12. The photosensitive unit is disposed on a side of the display panel and corresponding to the display light transmitting area 12.

Specifically, the photosensitive unit includes a fingerprint recognition sensor, a camera, a structured light sensor, a time-of-flight sensor, a distance sensor, a light sensor, and the like, so that sensors can collect a signal through the display light transmitting area, thereby achieving the display device with under-screen sensing solutions such as under-screen fingerprint recognition, under-screen camera, under-screen face recognition, and under-screen distance sensing.

The display panel and the display device provided in embodiments of the present application have advantages that the gap is provided between the edge of the metal contact layer located in the non-display area and the edge of the second flat layer covering the first conductive layer, that is, the second flat layer in the non-display area is not shielded by the metal contact layer. Thus, the water vapor in the second flat layer can be released longitudinally outward, thereby improving water vapor releasing performance of the second flat layer. The situation where the water vapor is laterally diffused inside the second flat layer and into the display area resulting in the internal shrinkage of the light-emitting pixels at the edge of the display area due to absorbing water is improved. The occurrence probability of the red border line is reduced, and the display effect of the display panel is improved.

Although the present application has disclosed the above preferred embodiments, the above preferred embodiment is not intended to limit the present application. A person with ordinary skill in the art may make various changes and modifies without departing from the spirit and scope of the present application. Therefore, protection scope of the present application is subject to the scope defined by the claims.

What is claimed is:

1. A display panel, wherein the display panel comprises a display area and a non-display area surrounding the display area, the display panel comprising:
   a substrate;
   a pixel drive circuit layer disposed on the substrate and located in the display area, and comprising a plurality of pixel drive circuits;
   a first flat layer disposed on a side of the pixel drive circuit layer away from the substrate;
   a first conductive layer disposed on a side of the first flat layer away from the substrate and electrically connected to a corresponding pixel drive circuit through a first through-hole penetrating the first flat layer;
   a second flat layer disposed on a side of the first conductive layer away from the substrate;
   a first electrode disposed on a side of the second flat layer away from the substrate and electrically connected to the first conductive layer through a second through-hole penetrating the second flat layer;
   a metal contact layer disposed on a side of the pixel drive circuit layer away from the substrate and in the non-display area, provided with same conductive material as the first electrode, wherein a gap is provided between an edge of the metal contact layer and an edge of the second flat layer, and a size of the gap is greater than or equal to 10 μm along a direction from the display area to the non-display area;

a light-emitting layer disposed on a side of the first electrode away from the substrate; and a second electrode disposed on a side of the light-emitting layer away from the substrate and electrically connected to the metal contact layer in the non-display area;

wherein the light-emitting layer comprises a plurality of light-emitting pixels, the display panel comprises a plurality of first vent holes defined in the display area, the first vent hole is defined between the first electrodes corresponding to the adjacent light-emitting pixels, one end of the first vent hole extends to the first electrode, and the other end of the first vent hole penetrates the second flat layer.

2. The display panel according to claim 1, wherein the non-display area comprises a first non-display area and a second non-display area, the first non-display area is located between the display area and the second non-display area, the second flat layer extends from the display area to the first non-display area, and the metal contact layer is disposed in the second non-display area.

3. The display panel according to claim 1, wherein the display panel further comprises:

a second conductive layer disposed on a side of the second flat layer away from the substrate; and a third flat layer disposed on a side of the second conductive layer away from the substrate, wherein the first electrode is electrically connected to the second conductive layer through a third through-hole penetrating the third flat layer, the second conductive layer is electrically connected to the first conductive layer through the second through-hole, and a gap is provided between the edge of the metal contact layer and an edge of the third flat layer.

4. The display panel according to claim 3, wherein the display panel further comprises:

a third conductive layer disposed on a side of the third flat layer away from the substrate; and a fourth flat layer disposed on a side of the third conductive layer away from the substrate, wherein the first electrode is electrically connected to the third conductive layer through a fourth through-hole penetrating the fourth flat layer, the third conductive layer is electrically connected to the second conductive layer through the third through-hole, and a gap is provided between the edge of the metal contact layer and an edge of the fourth flat layer.

5. The display panel according to claim 1, wherein the first vent hole is defined close to the non-display area.

6. A display panel, wherein the display panel comprises a display area and a non-display area surrounding the display area, the display panel comprising:

a substrate;

a pixel drive circuit layer disposed on the substrate and located in the display area, and comprising a plurality of pixel drive circuits;

a first flat layer disposed on a side of the pixel drive circuit layer away from the substrate;

a first conductive layer disposed on a side of the first flat layer away from the substrate and electrically connected to a corresponding pixel drive circuit through a first through-hole penetrating the first flat layer;

a second flat layer disposed on a side of the first conductive layer away from the substrate;

a first electrode disposed on a side of the second flat layer away from the substrate and electrically connected to the first conductive layer through a second through-hole penetrating the second flat layer;

a metal contact layer disposed on a side of the pixel drive circuit layer away from the substrate and in the non-display area, and a gap being provided between an edge of the metal contact layer and an edge of the second flat layer;

a light-emitting layer disposed on a side of the first electrode away from the substrate; and a second electrode disposed on a side of the light-emitting layer away from the substrate and electrically connected to the metal contact layer in the non-display area;

wherein the light-emitting layer comprises a plurality of light-emitting pixels, the display panel comprises a plurality of first vent holes defined in the display area, the first vent hole is defined between the first electrodes corresponding to the adjacent light-emitting pixels, one end of the first vent hole extends to the first electrode, and the other end of the first vent hole penetrates the second flat layer.

7. The display panel according to claim 6, wherein the non-display area comprises a first non-display area and a second non-display area, the first non-display area is located between the display area and the second non-display area, the second flat layer extends from the display area to the first non-display area, and the metal contact layer is disposed in the second non-display area.

8. The display panel according to claim 6, wherein the display panel further comprises:

a second conductive layer disposed on a side of the second flat layer away from the substrate; and a third flat layer disposed on a side of the second conductive layer away from the substrate, wherein the first electrode is electrically connected to the second conductive layer through a third through-hole penetrating the third flat layer, the second conductive layer is electrically connected to the first conductive layer through the second through-hole, and a gap is provided between the edge of the metal contact layer and an edge of the third flat layer.

9. The display panel according to claim 8, wherein the display panel further comprises:

a third conductive layer disposed on a side of the third flat layer away from the substrate; and a fourth flat layer disposed on a side of the third conductive layer away from the substrate, wherein the first electrode is electrically connected to the third conductive layer through a fourth through-hole penetrating the fourth flat layer, the third conductive layer is electrically connected to the second conductive layer through the third through-hole, and a gap is provided between the edge of the metal contact layer and an edge of the fourth flat layer.

10. The display panel according to claim 6, wherein the first vent hole is defined close to the non-display area.

11. The display panel according to claim 6, wherein a plurality of second vent holes are provided at intervals on the metal contact layer, and the second vent hole penetrates the metal contact layer.

12. The display panel according to claim 11, wherein the second vent hole is defined close to the display area.

13. The display panel according to claim 6, wherein a size of the gap is greater than or equal to 10 µm along a direction from the display area to the non-display area.

14. The display panel according to claim 6, wherein the pixel drive circuit layer comprises:

a semiconductor layer disposed on the substrate;
a gate insulating layer overlaid on the semiconductor layer;
a first gate layer disposed on the gate insulating layer;
a first interlayer insulated layer overlaid on the first gate layer and the gate insulating layer;
a second gate layer disposed on the first gate layer;
a second interlayer insulated layer overlaid on the second gate layer and the first interlayer insulated layer;
a source drain metal layer disposed on the second interlayer insulated layer, and wherein the first conductive layer is electrically connected to the source drain metal layer through the first through-hole; and
the first flat layer disposed on the source drain metal layer.

15. The display panel according to claim 14, wherein the display panel further comprises a power supply signal line disposed in the non-display area, the power supply signal line is disposed on a same layer as the source drain metal layer, and the metal contact layer is electrically connected to the power supply signal line.

16. The display panel according to claim 6, wherein the metal contact layer is provided with same conductive material as the first electrode.

17. The display panel according to claim 6, wherein the display area comprises a main display area, a light transmission area, and a transition display area between the main display area and the light transmission area; and
the first conductive layer comprises a plurality of transparent traces extending from the transition display area to the light transmission area, and wherein the plurality of pixel drive circuits comprises a first pixel drive circuit disposed in the transition display area, the light-emitting layer comprises a first light-emitting layer disposed in the light transmission area, and the first pixel drive circuit is electrically connected to the first light-emitting layer through the transparent traces to drive the first light-emitting layer to emit light.

18. A display device, comprising a display panel and a sensing unit disposed on a side of the display panel and corresponding to a light transmission area, wherein the display panel comprises a display area and a non-display area surrounding the display area, the display area comprises a main display area, the light transmission area, and a transition display area between the main display area and the light transmission area, and the display panel comprises:
a substrate;
a pixel drive circuit layer disposed on the substrate and located in the display area, and comprising a plurality of pixel drive circuits;
a first flat layer disposed on a side of the pixel drive circuit layer away from the substrate;
a first conductive layer disposed on a side of the first flat layer away from the substrate and electrically connected to a corresponding pixel drive circuit through a first through-hole penetrating the first flat layer;
a second flat layer disposed on a side of the first conductive layer away from the substrate;
a first electrode disposed on a side of the second flat layer away from the substrate and electrically connected to the first conductive layer through a second through-hole penetrating the second flat layer;
a metal contact layer disposed on a side of the pixel drive circuit layer away from the substrate and in the non-display area, and wherein a gap is provided between an edge of the metal contact layer and an edge of the second flat layer;
a light-emitting layer disposed on a side of the first electrode away from the substrate; and
a second electrode disposed on a side of the light-emitting layer away from the substrate and electrically connected to the metal contact layer in the non-display area.

* * * * *